United States Patent
Noma et al.

(10) Patent No.: US 11,264,264 B2
(45) Date of Patent: Mar. 1, 2022

(54) SOLDER BUMP FORMATION USING WAFER WITH RING

(71) Applicant: SEMICONDUCTOR COMPONENTS INDUSTRIES, LLC, Phoenix, AZ (US)

(72) Inventors: Takashi Noma, Ota (JP); Noboru Okubo, Kumagaya (JP); Yusheng Lin, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 175 days.

(21) Appl. No.: 16/661,686

(22) Filed: Oct. 23, 2019

(65) Prior Publication Data

US 2021/0028051 A1 Jan. 28, 2021

Related U.S. Application Data

(60) Provisional application No. 62/878,213, filed on Jul. 24, 2019.

(51) Int. Cl.

| H01L 21/78 | (2006.01) |
| H01L 21/30 | (2006.01) |
| H01L 21/687 | (2006.01) |
| H01L 23/00 | (2006.01) |
| H01L 21/683 | (2006.01) |
| H01L 29/861 | (2006.01) |
| H01L 29/739 | (2006.01) |

(52) U.S. Cl.
CPC .... *H01L 21/68735* (2013.01); *H01L 21/6836* (2013.01); *H01L 21/78* (2013.01); *H01L 24/03* (2013.01); *H01L 24/11* (2013.01); *H01L 24/13* (2013.01); *H01L 24/81* (2013.01); *H01L 29/7393* (2013.01); *H01L 29/861* (2013.01); *H01L 2224/0346* (2013.01); *H01L 2224/1147* (2013.01)

(58) Field of Classification Search
CPC ........ H01L 24/13; H01L 24/11; H01L 24/03; H01L 24/81; H01L 24/78; H01L 21/68735; H01L 21/6836; H01L 21/78
See application file for complete search history.

(56) References Cited

U.S. PATENT DOCUMENTS

| 2006/0049514 | A1 | 3/2006 | Fuchs et al. | |
| 2008/0242052 | A1* | 10/2008 | Feng | H01L 21/3043 438/459 |
| 2010/0308442 | A1* | 12/2010 | Naka | H01L 24/11 257/620 |
| 2011/0031596 | A1 | 2/2011 | Gruenhagen et al. | |

(Continued)

*Primary Examiner* — Kenneth Parker
*Assistant Examiner* — Long H Le
(74) *Attorney, Agent, or Firm* — Brake Hughes Bellermann LLP

(57) ABSTRACT

At least one circuit element may be formed on a front side of a ringed substrate, and the ringed substrate may be mounted on a mounting chuck. The mounting chuck may have an inner raised portion configured to receive the thinned portion of the substrate thereon, and a recessed ring around a perimeter of the mounting chuck configured to receive the outer ring of the ringed substrate therein. At least one solder bump may be formed that is electrically connected to the at least one circuit element, while the ringed wafer is disposed on the mounting chuck.

20 Claims, 17 Drawing Sheets

(56) References Cited

U.S. PATENT DOCUMENTS

2014/0113410 A1* 4/2014 Hwang .................. H01L 24/11
438/107
2018/0005951 A1 1/2018 Lin et al.
2018/0247870 A1* 8/2018 Priewasser ............. H01L 21/78

* cited by examiner

Cu RDL & 2nd PI formation

SOLDER BUMP FORMATION USING WAFER WITH RING

CROSS-REFERENCE TO RELATED APPLICATIONS

This application claims the benefit of U.S. Provisional Patent Application No. 62/878,213, filed on Jul. 24, 2019, the entire contents of which is incorporated herein by reference.

TECHNICAL FIELD

This description relates to wafer-level solder bump formation on wafers with rings.

BACKGROUND

In the integrated circuit (IC) industry, there are ongoing efforts to make devices more compact, while maintaining or improving operational characteristics of the devices. At the same time, it is desirable to increase the speed, reliability, and efficiency of associated manufacturing processes.

For example, it may be desirable to use very thin substrates, such as Silicon (Si) substrates, when forming integrated circuit devices. In addition to enabling more compact devices, the thin substrates have other advantages, such as facilitating dual-side (e.g., top/bottom or front/back) processing. For example, back side ion implantation may be enabled.

Further, it may be desirable to use wafers with relatively large sizes (and corresponding larger surface areas). For example, larger wafer sizes (e.g., eight inches in diameter, as compared to four or six inches) generally enable formation of more devices per wafer, and generally provide better utilization of wafer area, as compared to relatively smaller wafers.

However, large, thin wafers are susceptible to thermal and mechanical stresses. As a result, such large, thin wafers may be prone to experience warping, chipping, or breaking.

Although techniques exist for mitigating or eliminating such difficulties, these techniques may limit or prevent other desired processing steps. As a result, in these and similar scenarios, it may be difficult or impossible to form desired device structures and aspects using known techniques.

SUMMARY

According to one general aspect, a method of making a semiconductor device may include forming at least one circuit element on a front side of a ringed substrate, an inner portion of a back side of the ringed substrate having been removed to obtain a thinned portion of the ringed substrate with an outer ring of remaining substrate material around a perimeter of the back side of the ringed substrate. The method may include mounting the ringed substrate on a mounting chuck, the mounting chuck having an inner raised portion configured to receive the thinned portion of the substrate thereon, and a recessed ring around a perimeter of the mounting chuck configured to receive the outer ring of the ringed substrate therein, and forming at least one solder bump electrically connected to the at least one circuit element, while the ringed wafer is disposed on the mounting chuck.

According to another general aspect, a semiconductor device manufacturing assembly includes a mounting assembly configured to support a wafer on which at least one circuit element is formed on a front side thereof, the wafer having a back side with a ring formed around a perimeter thereof and a thinned portion within the ring, and a mounting chuck disposed on the mounting assembly. The mounting chuck may include a raised portion configured to receive the thinned portion of the wafer, and a recessed portion configured to receive the ring of the wafer. The mounting semiconductor device manufacturing assembly may include a mask configured to form at least one solder bump for electrical connection to the at least one circuit while the wafer is disposed on the mounting chuck with the thinned portion of the wafer on the raised portion of the mounting chuck, and the ring of the wafer disposed within the recessed portion of the mounting chuck.

According to another general aspect, a semiconductor device may include at least one integrated circuit formed on a substrate, the substrate having a thickness less than about 300 microns. The semiconductor device may include at least one solder bump formed on the integrated circuit, the solder bump having a thickness greater than about 150 microns.

The details of one or more implementations are set forth in the accompanying drawings and the description below. Other features will be apparent from the description and drawings, and from the claims.

DETAILED DESCRIPTION

FIGS. 1A-11H illustrate example operations and devices for processing large, thin wafers, in a manner that prevents warping of the wafers during processing, and that includes the adding of wafer-level solder bumps for electrical interconnections. Accordingly, it is possible to produce integrated circuits in a fast, reliable, and efficient manner, while obtaining the advantages of the included solder bumps (as compared to other methods of interconnection, such as wire bonding and/or solder placement with reflow).

More specifically, as referenced above, large, thin semiconductor wafers are subject to damage from mechanical and/or thermal stresses, including warping, chipping, or breaking. It is possible to mitigate or eliminate such difficulties by providing a temporary stabilization ring around a perimeter of the large, thin wafers.

For example, a ringed wafer may be obtained by grinding an inner portion of a wafer to a desired thinness, while leaving (i.e., not grinding) an outer ring within a defined distance from an edge of the wafer. The ring may then be used to enable stabilized handling, and to provide structural support to thereby prevent warping, chipping, or breaking of the wafer during subsequent processes. Then, the ring may be removed prior to a dicing of the individual circuits or circuit elements on the wafer.

However, such ringed wafers are typically created and/or handled by mounting an original (thicker) wafer using a tape or resin on one side (e.g., a top side), while then grinding an inner portion of the opposite (e.g., bottom) side to create the stabilizing ring around a perimeter of the opposite, bottom side. This mounting tape, sometimes referred to as back side grinding (BG) tape, blocks, hinders, or prevents other processing steps from being conducted with respect to the top side on which the BG tape is mounted.

In particular, as described in detail below, such BG tape hinders formation of connective solder bumps on the top side of the wafer, particularly solder bumps having a desired size in the range of about 100-150 microns or larger, such as 300-500 microns. Further, as also described in detail below, options for adding solder bumps during associated processing steps may be additionally limited by temperatures and other factors associated with executing those processing steps. In other words, e.g., solder bumps can not be suitably added during certain processing steps due to high temperatures leading to premature melting of the solder bumps, or due to possible solder contamination from other chemicals being used, or other handling issues.

Figure 1A:
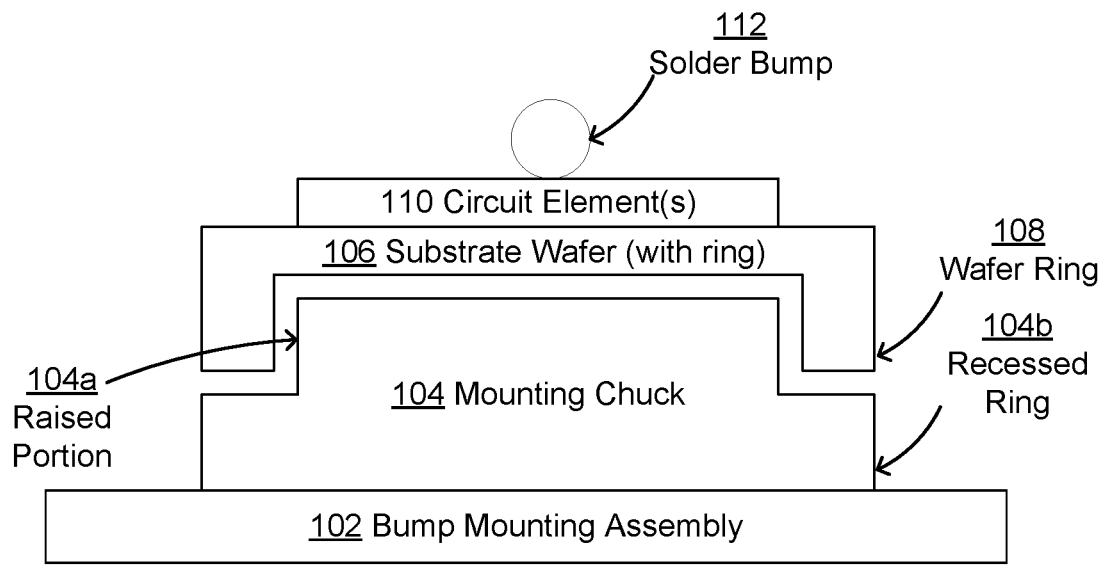
FIG. 1A is a block diagram of an example implementation of a solder bump mounting assembly.

In contrast, in FIG. 1A, a bump mounting assembly 102 is illustrated as including a mounting chuck 104 that includes a raised portion 104a and a recessed ring 104b. As shown, the mounting chuck 104 is thus configured to receive a substrate wafer, or wafer, 106, which has a wafer ring 108 formed around a perimeter thereof. That is, the wafer ring 108 may be disposed within the recessed ring 104b, with a thinned or recessed portion of the wafer 106 overlaying the raised portion 104a, to thereby secure the ringed wafer 106 with respect to the mounting chuck 104.

Accordingly, as shown, the ringed wafer 106 may be mounted in a stable and reliable manner, to thereby facilitate processing operations with respect to a circuit element(s) 110. In the following description, the circuit element 110 is described as being formed on a side of the ringed wafer referred to herein as a front side, or top side, which is opposite a side of the ringed wafer (referred to herein as a back side, or bottom side) that is disposed on, and secured by, the mounting chuck 104.

In particular, by mounting and securing the ringed wafer 106 using the mounting chuck 104, it is possible to form a solder bump 112 on the circuit element 110, in a flexible, efficient, reliable, manner. The solder bump 112 may also be referred to as a solder ball, solder sphere, or using other known or future nomenclature, and may be understood to represent any discrete element of soldering material that may be deposited on, or otherwise provided for, the circuit element 110, as described herein.

Figure 1B:
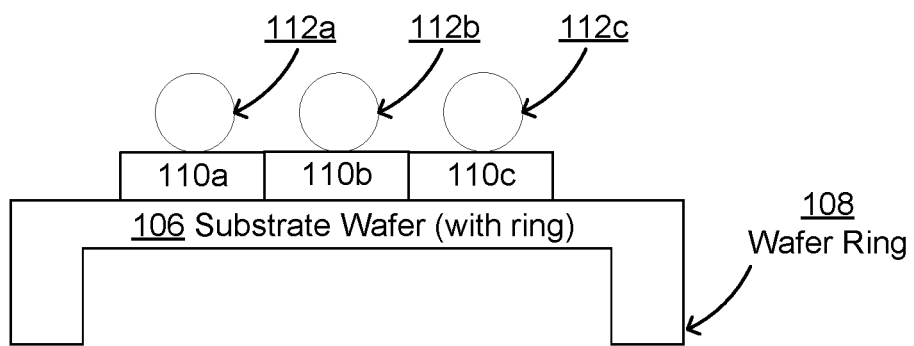
FIG. 1B is a more detailed block diagram of the solder bump mounting assembly of FIG. 1A, including multiple circuit elements.

As shown in FIG. 1B, a plurality of circuit elements illustrated as 110a, 110b, and 110c may each have a corresponding solder bump 112a, 112b, 112c formed thereon. Thus, the substrate 106 may be understood to have such a plurality of circuit elements 110a, 110b, 110c formed in a desired manner(s) over a surface area of the wafer 106. Further examples of formation of multiple circuit elements on a ringed wafer are illustrated and described below, e.g., with respect to FIG. 3.

During later processing stages, the wafer ring 108 may be removed and the wafer 106 may be diced using conventional techniques, to thereby leave the circuit element 110 of FIG. 1A, or the circuit elements 110a, 110b, 110c of FIG. 1B, connected to a remaining, thinned portion of the wafer 106, shown in FIG. 2 as substrate 202. As further illustrated in FIG. 2, the substrate 202, circuit element 110, and solder bump 112 may be mounted in a flip chip assembly to a circuit board 204. Further conventional techniques may be used to complete the solder connection process, including, e.g., addition of an adhesive underfill 206.

Figure 2:
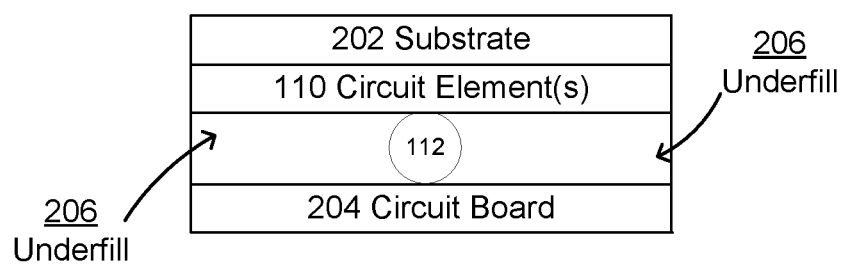
FIG. 2 is a block diagram of an integrated circuit assembly created using the solder bump mounting assembly of FIGS. 1A-1B.

Thus, FIGS. 1A, 1B, and 2 illustrate that the mounting chuck 104 of FIG. 1A may be used to facilitate and enable top or front-side processing of a ringed wafer, such as the ringed wafer 106, and including formation of the solder bump 112. As referenced above, and described in more detail below, the mounting chuck 104 provides these and other advantages including, e.g., enabling the top or front-side processing during processing stages during which (or after which) the solder bump 112 is not subjected to undesirable thermal, chemical, mechanical, or other stresses, and prior to being flipped for mounting to the circuit board 204.

Further, as also referenced and described, the mounting chuck 104 enables top or front-side processing of the wafer 106 by securing the wafer 106, including the wafer ring 108, at a processing stage following removal of the BG tape used to secure the wafer 106 during the grinding of the wafer ring 108. Thus, the approach of FIG. 1A enables convenient use of various techniques for forming the solder bump 112, such as the ball mask techniques illustrated and described below, with respect to FIG. 4.

In contrast, conventional techniques typically perform front-side processing prior to grinding a ring (such as the ring 108). Then, during the grinding, the BG tape is used to secure the wafer while the ring is formed. If necessary/desired, the BG tape may remain while certain back side processing operations (such as back side implantation or diffusion) occur.

In these and similar scenarios, once the BG tape is removed, conventional techniques are not able to secure the ringed wafer suitably for further front-side, wafer-level processing (such as adding the solder bump 112). Instead, the conventional techniques may attempt to add solder connections following removal of the ring, and/or following dicing of the wafer. Such approaches are subject to a number of difficulties and challenges, such as a requirement for extremely precise (and error-prone) solder placement/formation for each circuit board to be used with circuit elements of the wafer in question. As a result, such techniques are subject to various difficulties, including potential solder shorts (e.g., short-circuit conditions between two or more solder connections), such as between a source and gate of a transistor element.

Put another way, conventional techniques can not suitably add solder bumps prior to ring grinding, due to the potential for disrupting subsequent processing steps. Such disruptions may include, e.g., damage to the solder bump during subsequent processing (including thermal/chemical/mechanical stresses during such subsequent processing), or reduced reliability of the BG tape. Further, conventional techniques can not add the solder bumps after the ring grinding but before wafer dicing, because the conventional techniques can not suitably and accurately position the ringed wafer for the addition of the solder bumps.

Of course, FIGS. 1A, 1B, and 2 provide highly-simplified views designed to illustrate the above and related aspects. More detailed, additional explanations and examples are provided with respect to FIGS. 3-11, below. It will be appreciated that FIGS. 1A, 1B, and 2 are not intended to be drawn to scale, and, further, omit many conventional aspects that would be apparent to one of skill in the art.

For example, the circuit element(s) 110 may represent many different examples of various circuit elements. For example, FIGS. 9 and 10 provide examples in which the circuit element(s) 110 represent a fast recovery diode (FRD) and/or an Insulated Gate Bipolar Transistor (IGBT). FIG. 11 provides more detailed examples with respect to wafer level packaging (WLP). However, these and other examples provided herein are not intended to be exclusive, limiting, or comprehensive. Thus, the circuit element(s) 110 may represent virtually any suitable structure, such as any suitable transistor, diode, or combinations thereof.

Similarly, although the wafer 106 may be described herein as being composed of Silicon (Si), other suitable substrate materials may be used. Further, various suitable materials may be used to form the solder bump 112, but are not described herein in detail.

In FIG. 1A and FIG. 1B, example areas for usable wafer area (e.g., chip area that will be retained following removal of the wafer ring 108, on which desired circuit elements 110 may be formed) may have a diameter(s) in a range of, e.g., 188 mm-196 mm, and a depth in a range(s) of 10-150 microns, and less then 300 microns. Example ranges for a width of the wafer ring 108 may be, e.g., 1-5 mm, and example depths/thicknesses of the wafer ring 108 may be, e.g., 200-1000 microns.

In example implementations, the substrate wafer 106 may be moved onto, or off of, the mounting chuck 104 using a suitable handling tool, e.g., a substantially non-contacting pick-up device. For example, a variation of a Bernoulli wand or Bernoulli handler may be used, which uses gas jets to create a pressure differential above the ringed wafer 106, to thereby cause the wafer to be drawn upwards.

Figure 3:
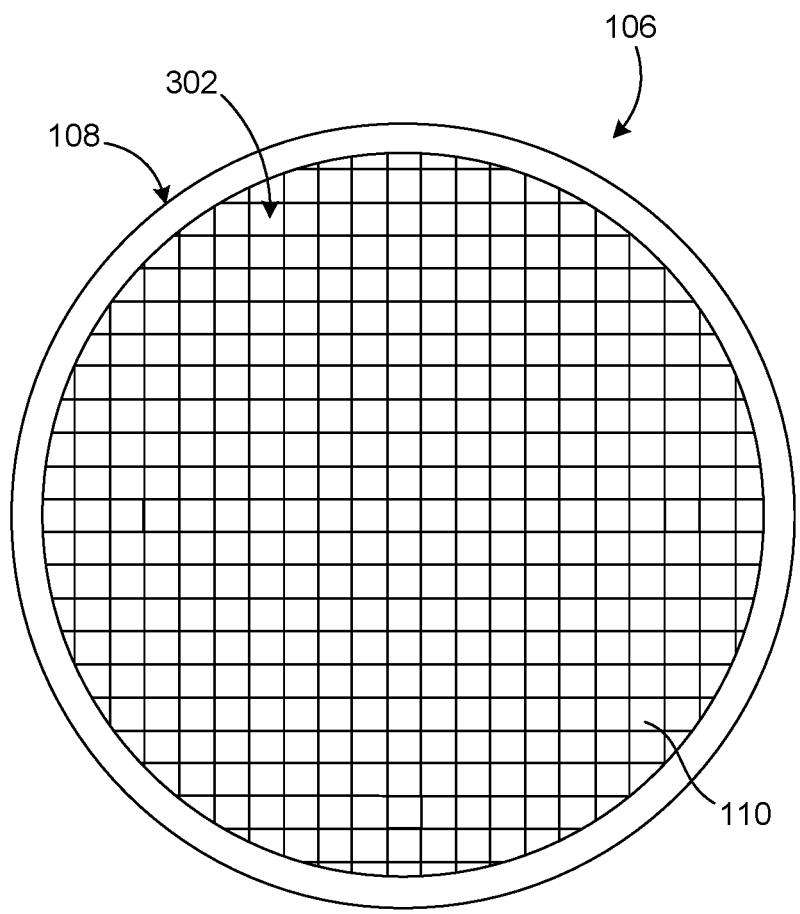
FIG. 3 illustrates a wafer with ring used in the solder bump mounting assembly of FIGS. 1A-1B.

The simplified views of FIGS. 1A, 1B, and 2 illustrate a cross-section of each of the elements included therein. FIG. 3 illustrates an example side view of the wafer 106 and ring 108, while FIG. 5 and FIGS. 6/7 provide side angle views of the bump mounting assembly 102 and the mounting chuck 104, respectively.

Specifically, FIG. 3 illustrates a front-side view of the wafer 106, including the ring 108 around a circumference thereof. In example implementations, the wafer 106 may be an 8-inch wafer, and the ring may have a width on the order of several millimeters, e.g., 3 mm. Of course, other sizes and widths may be used, as appropriate.

In FIG. 3, reference numeral 302 refers to a central, thinned portion of the wafer 106, formed as a recess within the ring 108. That is, the thinned portion 302 refers to an area of the wafer 106 in which the backgrinding process is performed.

FIG. 3 illustrates that the circuit element(s) 110, although shown in the singular in FIGS. 1A and 2, represent a plurality of circuit elements formed on the wafer 106 in a grid pattern. Accordingly, as is known, and as referenced herein, the circuit elements 110 may be singulated by dicing of the wafer 106.

Figure 4:
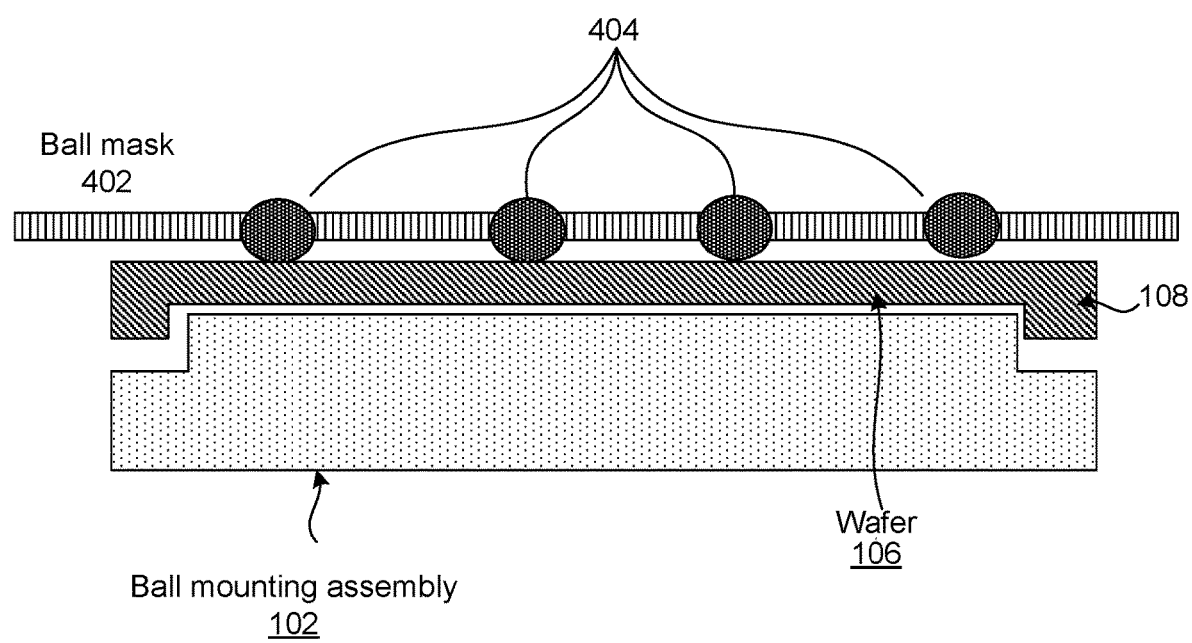
FIG. 4 is a more detailed example of an implementation of the solder bump mounting assembly of FIGS. 1A-1B.

FIG. 4 is a cross-section of an example implementation of the bump mounting assembly 102 of FIG. 1. As referenced above, and as shown in FIG. 4, the wafer 106 with ring 108 may be mounted on the mounting chuck 104.

Then, a ball mask 402 may be used to deposit solder bumps or balls 404. That is, considering FIGS. 3 and 4 together, it will be appreciated that the ball mask 402 may be used to form the solder bumps 404 over desired portions of the circuit elements 110 at a level of the wafer 106, in a fast, efficient, flexible, and reliable manner. For example, the solder bumps 404 may be of various types (e.g., different sizes, or different materials). Of course, other bump or ball-depositing techniques may be used, as well, due to the stable and accurate positioning and securing of the wafer 106 by the mounting chuck 104.

Figure 5:
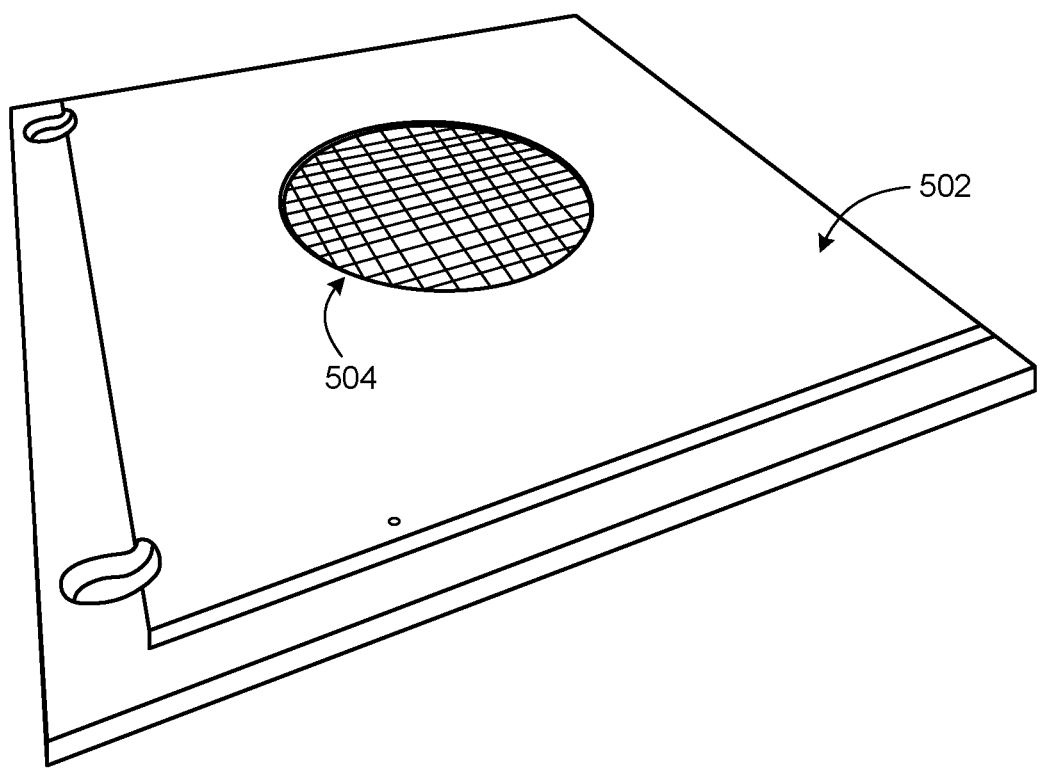
FIG. 5 illustrates another example implementation of the solder bump mounting assembly of FIGS. 1A-1B.

FIG. 5 illustrates another example implementation of the solder bump mounting assembly 102 of FIG. 1A. In FIG. 5, a solder bump mounting assembly 502 is illustrated as having a wafer 504 disposed therein.

Figure 6:
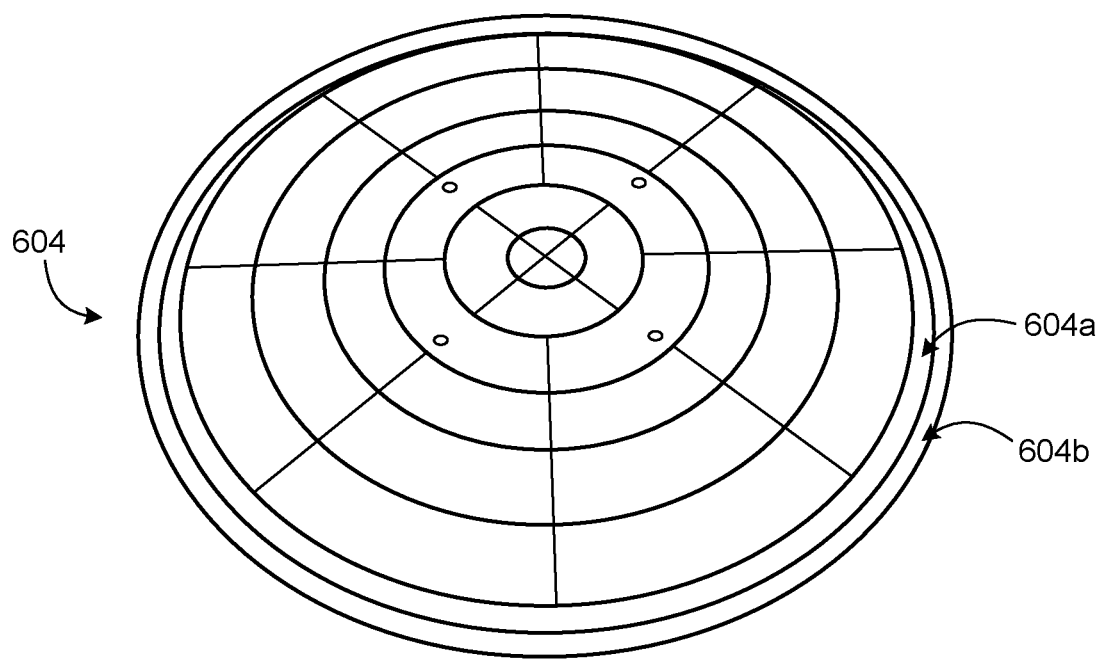
FIG. 6 is an illustration of a mounting chuck of the solder bump mounting assembly of FIG. 5.

FIG. 6 is an illustration of a mounting chuck 604 of the solder bump mounting assembly 502 of FIG. 5. The mounting chuck 604 provides an example implementation of the mounting chuck 104 of FIG. 1A.

As such, the mounting chuck 604 of FIG. 6 includes a raised portion 604a corresponding to the raised portion 104a of FIG. 1A, and a recessed ring 604b corresponding to the recessed ring 104b of FIG. 1A. Thus, it will be appreciated that a ring (e.g., the ring 108) formed by backgrinding of the wafer 504 may be disposed within the recessed ring 604b, while a thinned central portion of the wafer 504 (e.g., recessed portion 302 of FIG. 3) may be disposed on the raised portion 604a of the mounting chuck 602.

Figure 7:
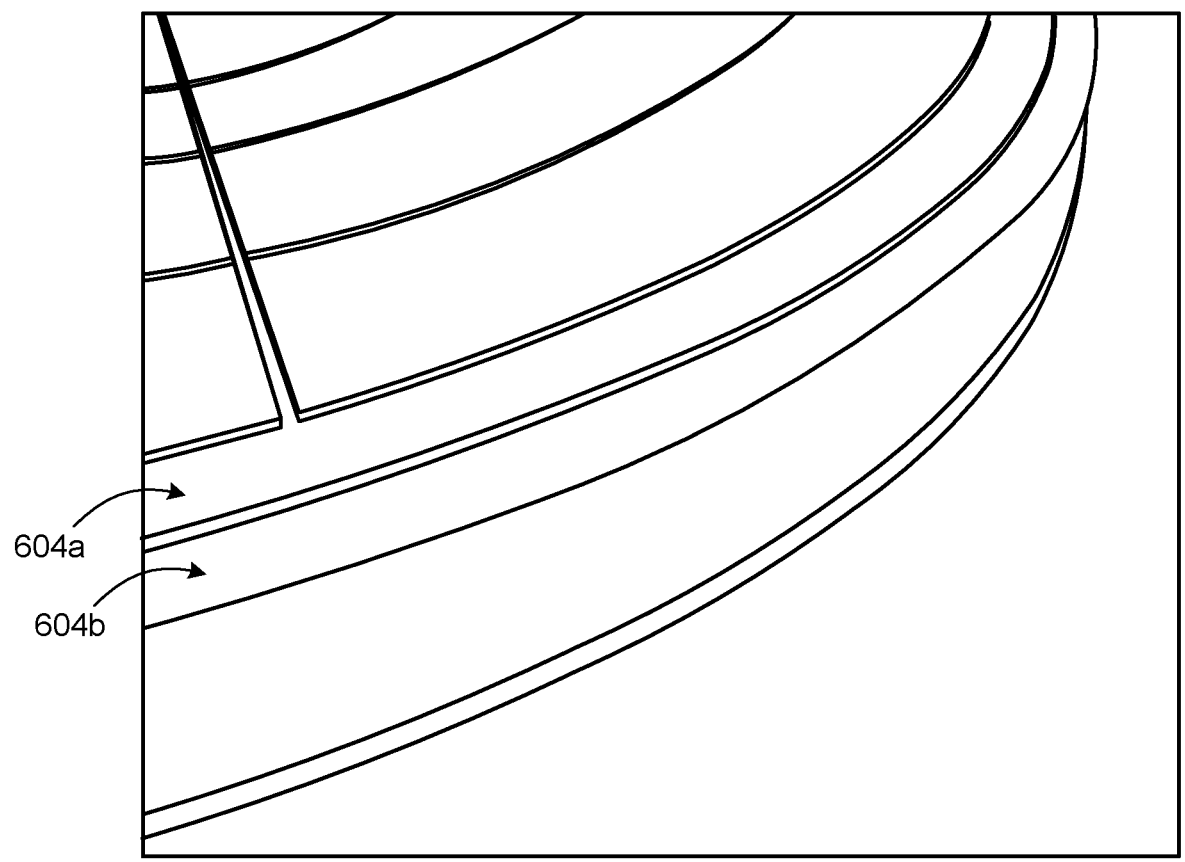
FIG. 7 is a magnified illustration of the mounting chuck of FIG. 7.

FIG. 7 is a magnified illustration of the mounting chuck of FIG. 7. FIG. 7 provides a magnified view of an edge of the raised portion 604a, and of the recessed ring 604b of FIG. 6.

Figure 8:
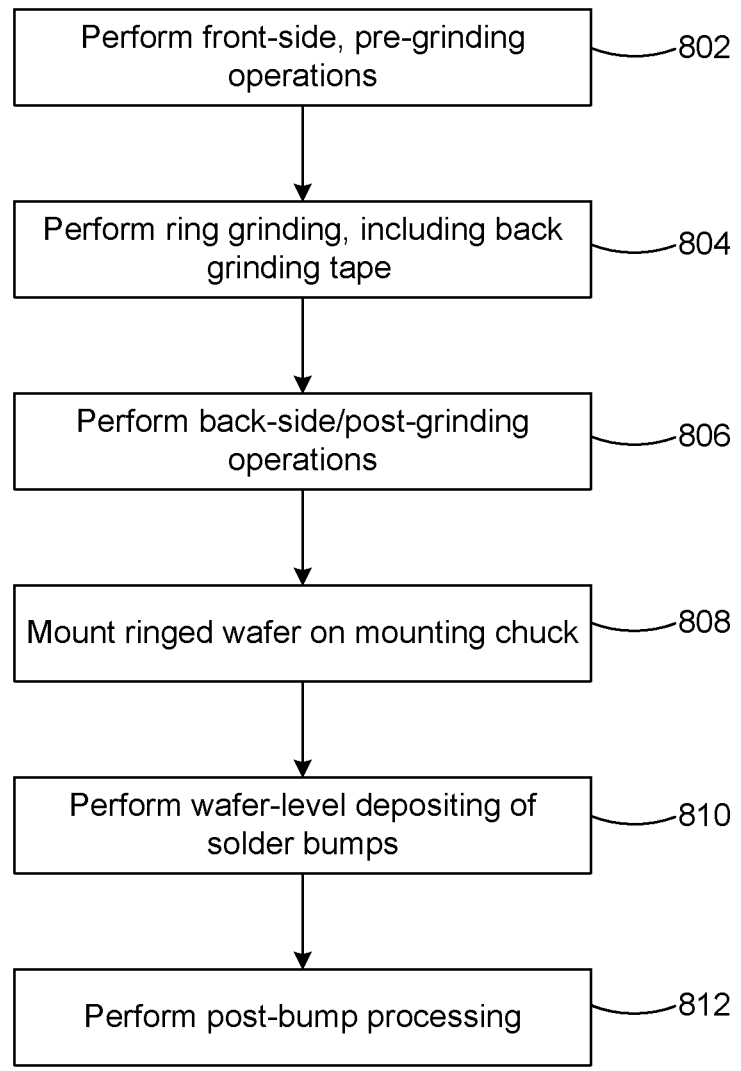
FIG. 8 is a flowchart illustrating example operations used to construct the circuit assembly of FIG. 2, using the solder bump mounting assembly of FIGS. 1A-1B.

FIG. 8 is a flowchart illustrating example process operations that may be used in example implementations of the system of FIG. 1. More detailed examples of the operations of FIG. 8 are provided below, with respect to FIGS. 9A-9I and 11A-11H.

In FIG. 8, a wafer (e.g., an 8 inch Si wafer as referenced above) undergoes front-side, pre-grinding operations (802). For example, such operations may include formation of insulating layers, openings within the insulating layers for electrical contact layers, and formation of the electrical contact layers.

Then, back grinding may be performed (804), including the use of backgrinding tape (BG tape). That is, the wafer with the front-side processing having been performed may be taped on the front side and mounted/stabilized with the BG tape so that the exposed back side of the wafer may undergo grinding, polishing, and/or any other operations required to form the ring 108 described above.

Back side post-grinding operations may then be conducted (806). For example, back side diffusion may occur, or, as illustrated in FIG. 9C, back side ion implantation (with subsequent annealing) may be performed. As shown in FIG. 9E, sputtering or other providing of back side contact layers may be performed. Additionally, or alternatively, a back side protection (BSP) tape may be applied over the back side of the thinned portion (302) of the wafer 106, within the ring 108, as shown in FIG. 11C.

It will be appreciated that the BG tape used to perform the back side grinding may be removed at one of a plurality of suitable processing stages, e.g., depending on what processing operations are to be included. For example, the BG tape may be removed following a selected one of the back side post-grinding operations referenced above. Then, as shown in FIG. 9F, it is possible to perform dual-side processing of certain operations, such as the dual-side plating operation(s) described with respect to FIG. 9F.

Then, the ringed wafer 106 (or 502) may be mounted on the mounting chuck 104 or 604 (808), as described above with respect to FIGS. 1 and 4-7. In this way, the ringed wafer 106 may be mounted in a stable, secure, accurate manner. This positioning enables and facilitates the use of the ball mask 402 of FIG. 4, or other appropriate technique for bump formation.

Accordingly, the solder bumps may be deposited (810). In particular, as referenced above and illustrated in the example of FIG. 4, it will be appreciated that the solder bumps are deposited at a wafer level. That is, e.g., the solder bumps 404 of FIG. 4 may be deposited together, and/or in a single operational stage, and prior to sawing or dicing of the wafer 106 into individual circuit elements 110.

Advantageously, and as described in more detail below, with respect to FIG. 10, wafer-level depositing of solder bumps 404 provides fast, accurate bump formation. Accordingly, the accurately-formed solder bumps enable accurate electrical contact to a circuit board, such as the circuit board 104 of FIG. 1. Additionally, or alternatively, as described with respect to FIG. 11A-11H, further wafer-level processing may occur.

Finally in FIG. 8, any post-bump processing may be performed (812). For example, as shown in both FIGS. 9H and 11G, sawing or dicing may be performed to remove the ring 108, and to individuate the circuit elements 110. Further, as referenced above, a flip-chip mounting may be executed, as shown in FIGS. 2 and 9I.

Figure 9A:
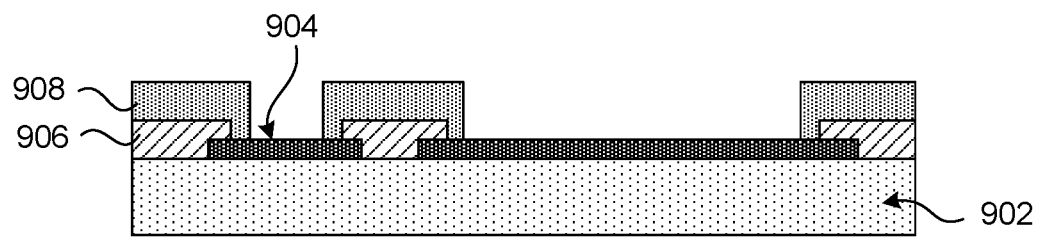
FIGS. 9A-9I illustrate an example process flow for constructing a first example circuit assembly using the solder bump mounting assembly of FIGS. 1A-1B.
Figure 9B:
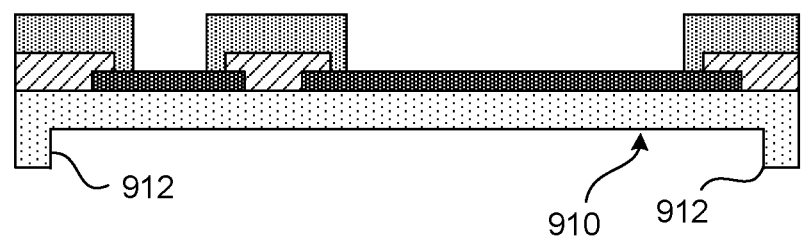
Figure 9C:
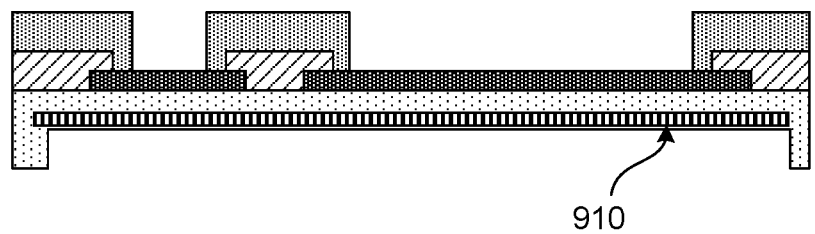
Figure 9D:
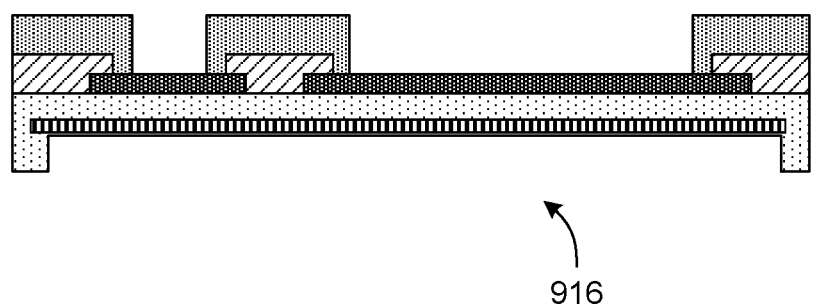
Figure 9E:
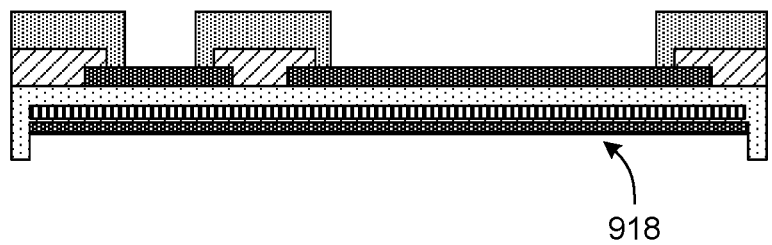
Figure 9F:
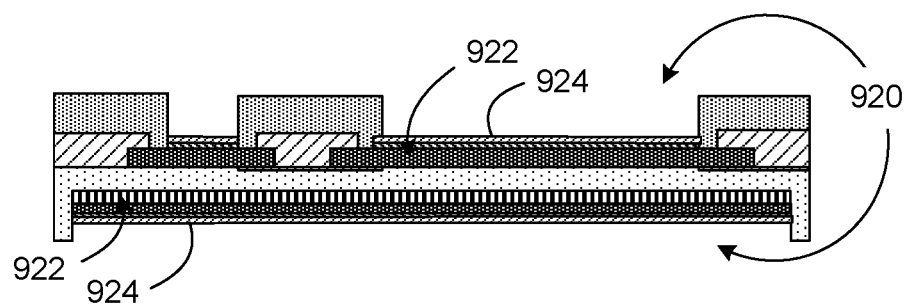
Figure 9G:
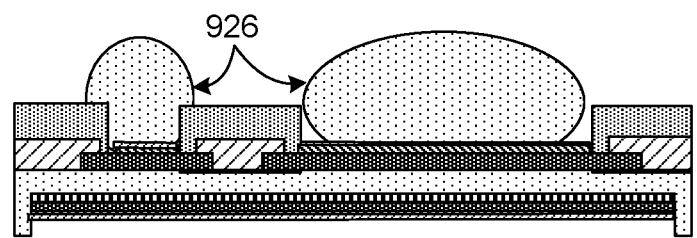
Figure 9H:
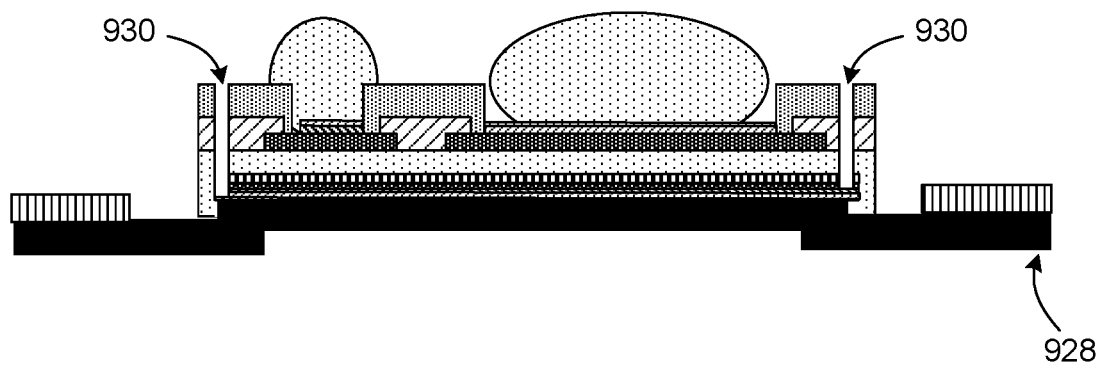
Figure 9I:
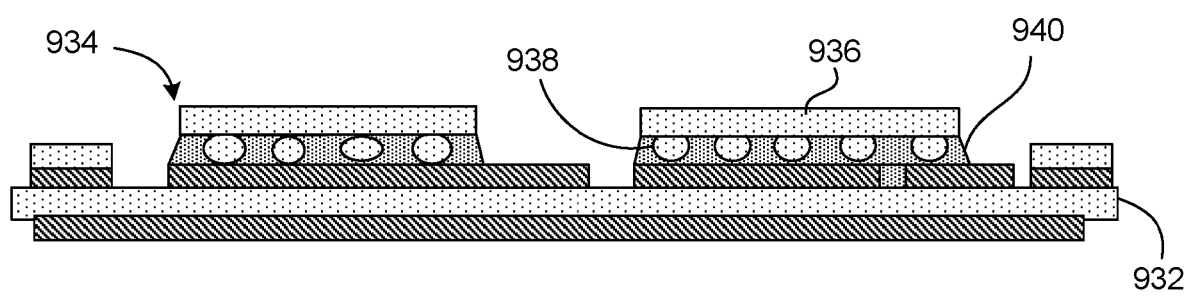
Figure 10:
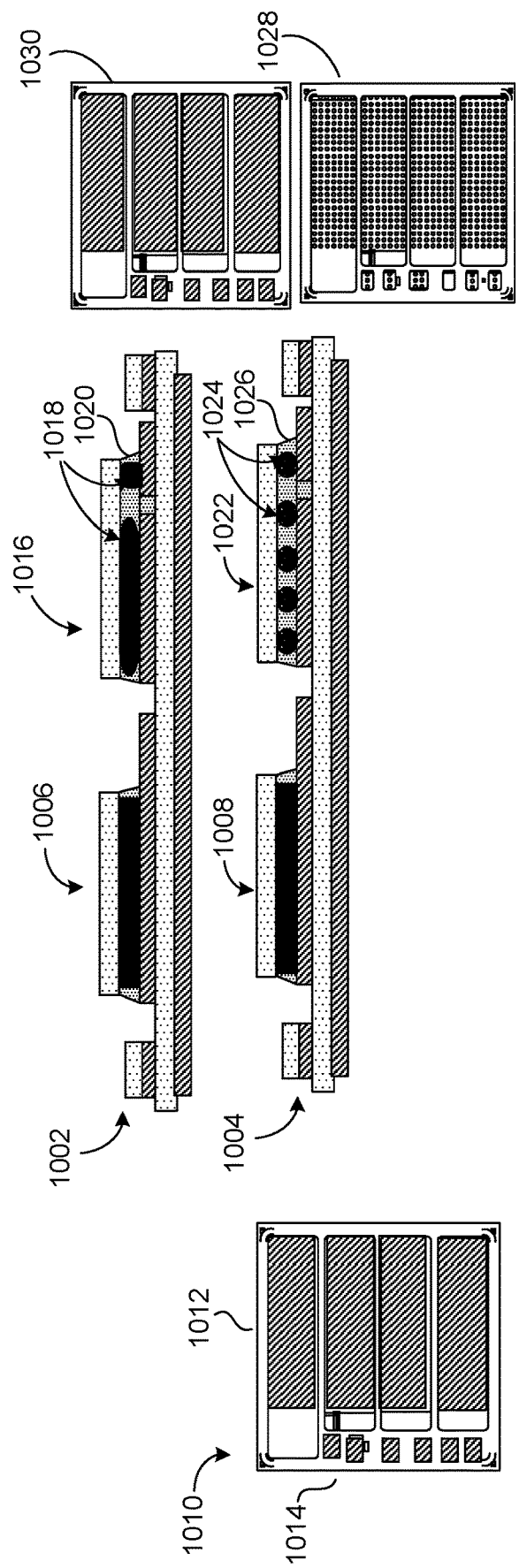
FIG. 10 illustrates example results of the example process flow of FIG. 9A-9I.

FIGS. 9A-9I show an example process flow for constructing a first example circuit assembly using the solder bump mounting assembly of FIGS. 1A and 1B. In FIG. 9A, a wafer Si substrate 902 is illustrated as having contacts 904 and associated circuit elements mounted thereon, where the contacts 904 may be made of AlCu, or AlSi. That is, although not shown explicitly in FIG. 9 for the sake of simplicity, aspects of desired circuit elements (e.g., FRD, or IGBT) may be included within the layer(s) 904.

Insulating layer(s) may be added as shown, such as oxi-nitride layer 906 and Polyimide (PI) layer 908, and associated coating and patterning. In FIG. 9, the surface of the Si substrate 902 with layers 904, 906, 908 is referred to herein as the top or front side, while the opposing side is referred to as the bottom or back side.

In conjunction with suitable BG tape (not shown in FIG. 9B) to mount the front side, known pre-steps and steps for implementing wafer ring grinding may be executed. As a result, as shown, a thin, central portion 910 of the wafer is formed, along with an outer ring 912 around a perimeter of the central portion 910. As referenced herein, the thinned, central portion 910 may be, e.g., in a range 100-200 microns in thickness, e.g., less than 300 microns.

Accordingly, back side ion implantation 914 may be conducted as shown in FIG. 9C, followed by activation annealing 916 in FIG. 9D. Sputtering of AlCu plating layer 918, along with suitable back side metal (BM) annealing and light ash processing, may be conducted, as shown in FIG. 9E.

Then, dual plating layers 920 may be formed on a front side and back side, as shown, using the known electroless nickel gold (ENIG) plating technique, and as illustrated in FIG. 9F. Thus, the dual plating layers 920 include Ni (Nickel) layers 922 and Au (Gold) layers 924, on each of the front side and back side, as shown.

The above-referenced ENIG processes are known to provide various advantages and features. For example, the referenced ENIG processes provide relatively thick Ni layers, which may offset undesirable Ni consumption by lead free solder that may occur during later additions of solder connections. Although thicker Ni layers may further contribute to undesired wafer warpage, the dual-side nature of the described ENIG processes, along with the ring 912, provide desired stabilization (e.g., avoid warpage) of the thinned portion 910.

Then, solder bumps 926 may be formed in any desired manner. In particular, as described above, the mounting chuck 104/604 of FIGS. 1A, 4, 6, and 7 may be used, along with the ball mask 404 of FIG. 4. As also referenced above, and illustrated in FIG. 9G, the solder bumps 926 may be made of any suitable material, and in a desired variety of sizes and shapes designed to match underlying electrical contacts.

Mounting tape 928 may be used to secure the wafer while ring cut 930 removes the ring 912, as shown in FIG. 9H. Dicing of the individual circuits may then proceed using conventional techniques.

As referenced with respect to FIG. 2, a flip-chip assembly procedure may then be conducted with respect to a suitable circuit board 932, such as a direct bonded copper (DBC) board. As shown in FIG. 9I, FRD 934 and IGBT 936 may be flip-mounted. Example solder bumps 938 (corresponding to solder bumps 926) are illustrated, along with suitable adhesive underfill 940.

Thus, FIGS. 9A-9I illustrate an example method of making an IGBT/FRD device with solder bump formation on ENIG plating as a solder top metal (STM), and with an ENIG back metal (BM). As illustrated and described, examples aspects of various method implementations include providing a Si substrate, and forming the IGBT/FRD device(s) with Al (Aluminum) wiring on the front side of the substrate. Then, forming a thinned portion (e.g., 100-200 um) and corresponding ring for supporting the wafer, using, e.g., wafer ring grinding on the back side of the wafer.

Ion plantation and activation annealing for the IGBT/FRD device(s) may be executed on the back side of the wafer, followed by forming an Al (e.g., Aluminum Copper, or AlCu) layer on the back side of the wafer. Then, the dual ENIG plating may be formed as the solder top metal (STM) and as a back metal, using the described electroless NiAu plating techniques (e.g., at approximately 1.5 microns). Following the formation of the solder bump formations on the NiAu STM, the wafer ring may be removed by an appropriate ring cut, and dicing of the wafer (e.g., blade dicing, or saw dicing) may proceed.

FIG. 10 illustrates example results of the example process flow of FIGS. 9A-9I. Specifically, in FIG. 10, a left-side portion illustrates example conventional process results, in which chips 1002, 1004 includes FRD devices 1006, 1008. In such conventional processes, solder placement is formed on the underlying DBC board for each relevant chip. Such approaches are thus subject to solder placement accuracy limitations that are governed by processing steps at relevant stages, which tend to be in a range of, e.g., 100-200 microns. As a result, as shown in chip 1010, a source 1012 and gate 1014 may be prone to short-circuits. Further, although not explicitly illustrated in FIG. 10, solder formed in these conventional processes is generally prone to voids (e.g., bubbles) being formed therein, which may reduce a reliability of the solder even when accurately formed.

In contrast, using the techniques described herein, device 1016 (e.g., IGFT) may be formed with solder bumps 1018 and adhesive underfill 1020, resulting in chip 1030. Alternatively, device 1022 may include solder bumps 1024 with adhesive underfill 1026, resulting in chip 1028.

In these examples, all chips of a given wafer may be formed using a one-time solder print/mount, and the described ball mounting techniques can realize relatively fine ball formations due to the available process limitations for such processes, e.g., 20-100 microns. In addition to improved accuracy and efficiency, solder voids are avoided, and the isolated bump design reduces solder stress levels with respect to underlying chips.

Figure 11A:
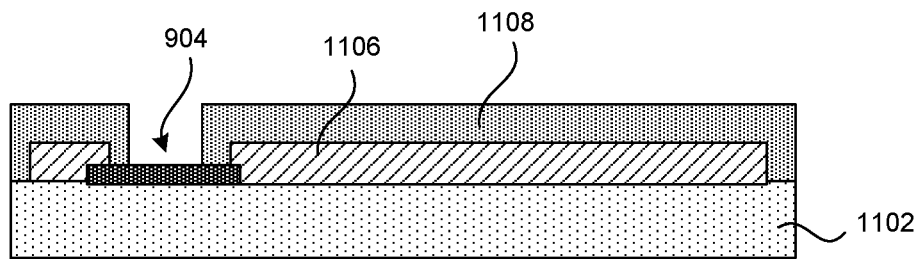
FIGS. 11A-11H are an example process flow for constructing a second example circuit assembly using the solder bump mounting assembly of FIGS. 1A-1B.
Figure 11B:
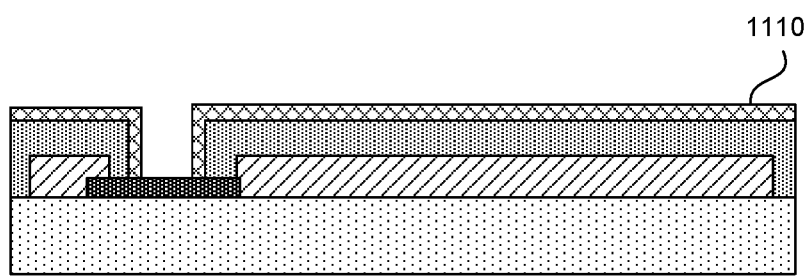
Figure 11C:
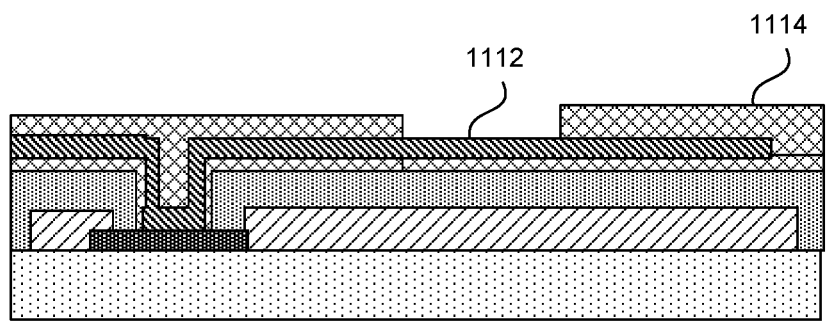

FIGS. 11A-11H illustrate an example process flow for constructing a second example circuit assembly using the solder bump mounting assembly of FIG. 1. In FIG. 11A, Si substrate 1102 receives contact layer 1104 of AlCu or AlSi (and associated circuit element(s)), and associated patterning of insulating layer 1106 of oxi-nitride, and PI layer 1108. A first PI coating and patterning layer 1110 in FIG. 11B is followed by a Cu RDL (redistribution layer) 1112 and a second layer of PI 1114 in FIG. 11C.

Figure 11D:
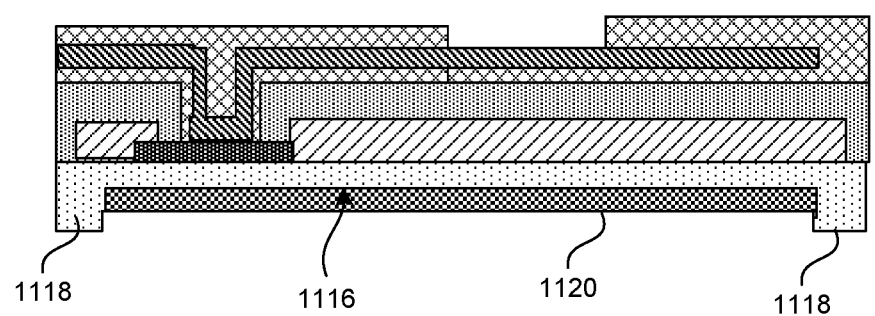

Then, as referenced above, and as illustrated in FIG. 11D, suitable BG tape and other suitable grinding techniques may be used to form thinned portion 1116 and ring 1118 of the original substrate 1102. In the example, a back side protection (BSP) tape 1120 is applied to the thinned portion 1116.

Figure 11E:
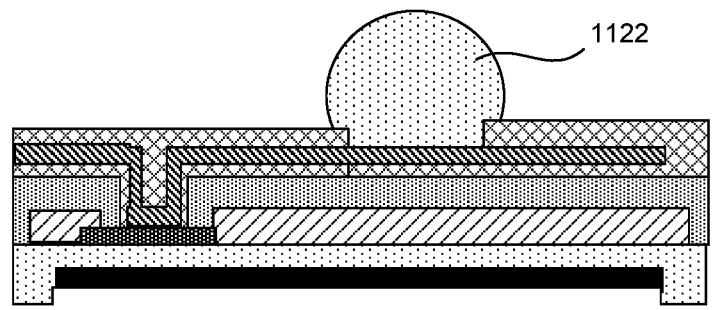
Figure 11F:
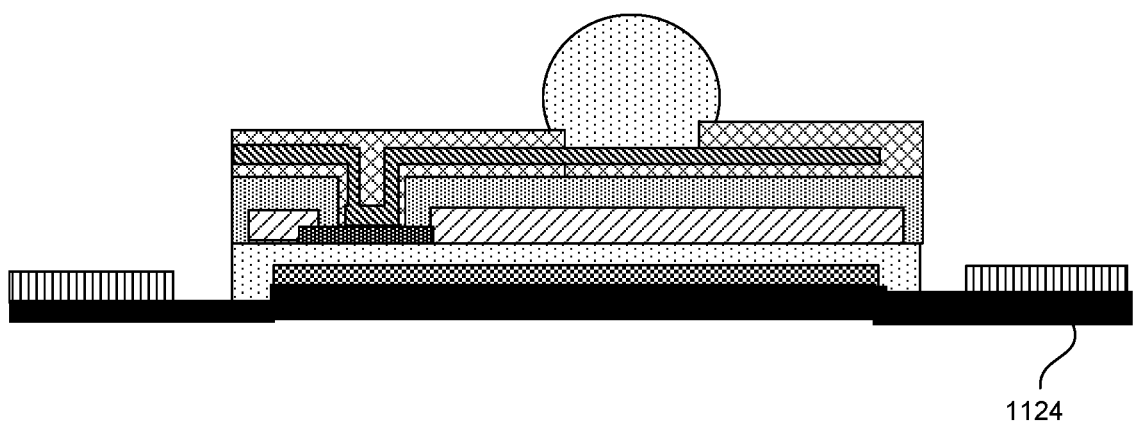
Figure 11G:
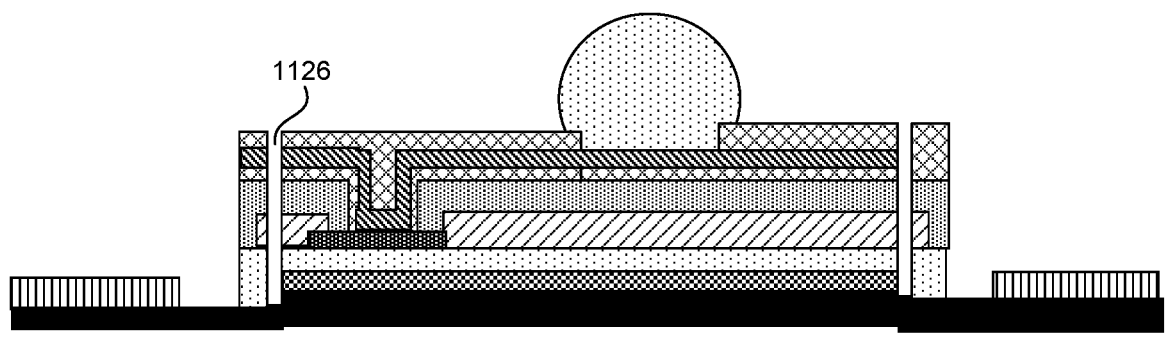
Figure 11H:
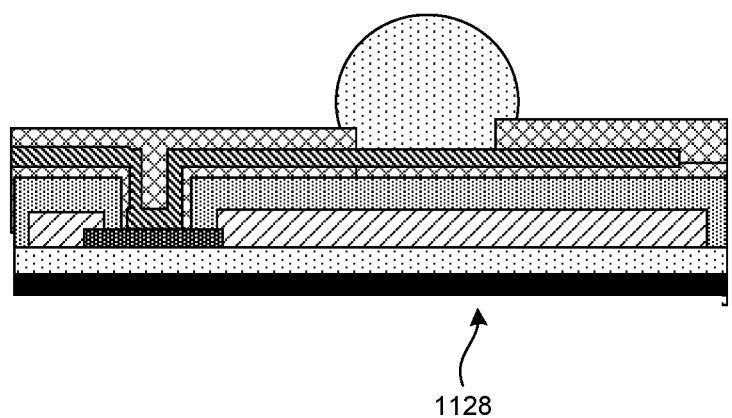

As shown in FIG. 11E, using the mounting chuck 104/604 of FIGS. 1A, 4, 6, and 7, example solder bump 1122 may be formed. Then, in FIG. 11F, tape mounting layer 1124 may be attached to facilitate conventional chip dicing, including ring cut 1126 of FIG. 11G. In this way, wafer level bump mounting 1128 of FIG. 11H is achieved.

Techniques of FIGS. 11A-11H enable use of wafer-level solder bumps 1122 for thinned substrates that are, e.g., 200 microns or less, even when the solder bumps are desired to be relatively large (e.g., greater than 100 microns, such as 300-500 microns). For example, relatively larger solder bumps may be desired based on characteristics of the underlying circuits, and/or to ensure suitably reliable electrical contacts. For example, in some example use cases, larger solder bumps providing a correspondingly larger substrate gap may be associated with improved thermal cycling reliability, and/or improvements in underfill wettability.

Thus, thin Si substrates may be used for wafer level processing using solder bumps, including the described and illustrated method of making a WLP with high solder bump formation on a Cu redistribution layer RDL. The method may include providing a Si substrate, and forming a semiconductor device/integrated circuit on the Si substrate. Following formation of a first PI layer, under back metal layer, Cu RDL, and second PI layer, the thinned portion of the Si wafer and corresponding Si ring for supporting the wafer may be formed, e.g., by a wafer grinding process, or similar process. Following formation of a back side protection tape BSP on the back side (grinded side) of the wafer, solder bump formation on the Cu RDL may proceed. Finally, the wafer ring may be removed by an appropriate ring cut, and dicing (e.g., blade dicing, or saw dicing) may be completed.

In some implementations, a semiconductor device may include a plurality of integrated circuits formed on a front side of a thinned portion of a ringed wafer, the ringed wafer including an outer ring around a perimeter of a back side of the ringed wafer. The semiconductor device may include at least one integrated circuit of the plurality of integrated circuits having a thickness less than about 300 microns, and at least one solder bump formed on, and electrically connected to, the at least one integrated circuit, the solder bump having a thickness greater than about 150 microns.

In implementations of such semiconductor devices, a circuit board may be electrically connected to the integrated circuit using the at least one solder bump. The at least one integrated circuit may include at least one of a fast recovery diode (FRD) and an insulated gate bipolar transistor (IGBT). The semiconductor device may include dual electroless nickel gold (ENIG) plating, including a first layer electrically connected between the at least one circuit element and the at least one solder bump, and a second layer on an opposing side of the ringed wafer.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method of making a semiconductor device, comprising:
    forming at least one circuit element on a front side of a ringed substrate, an inner portion of a back side of the ringed substrate having been removed to obtain a thinned portion of the ringed substrate with an outer ring of remaining substrate material around a perimeter of the back side of the ringed substrate;
    mounting the ringed substrate on a mounting chuck, the mounting chuck having an inner raised portion configured to receive the thinned portion of the substrate thereon, and a recessed ring around a perimeter of the mounting chuck configured to receive the outer ring of the ringed substrate therein; and
    forming at least one solder bump electrically connected to the at least one circuit element, while the ringed substrate is disposed on the mounting chuck.

2. The method of claim 1, wherein the at least one circuit element includes at least one of a fast recovery diode (FRD) and an insulated gate bipolar transistor (IGBT).

3. The method of claim 1, further comprising:
    forming, prior to the mounting, dual electroless nickel gold (ENIG) plating on, and electrically connected to, the at least one circuit element, and on the inner portion of the back side of the substrate; and
    forming the at least one solder bump on, and electrically connected to, the front side ENIG plating.

4. The method of claim 1, wherein the inner portion is removed including:
    securing the front side of the substrate with back side grinding (BG) tape;
    grinding the back side of the substrate to define the thinned portion and the outer ring; and
    removing the BG tape.

5. The method of claim 1, wherein the at least one circuit element includes a plurality of circuit elements formed on the front side of the substrate, and wherein forming the at least one solder bump comprises forming a plurality of solder bumps across the substrate and electrically connected to each of the plurality of circuit elements.

6. The method of claim 5, wherein forming the plurality of solder bumps comprises:
    providing a mask over the front side of the substrate while the substrate is mounted on the mounting chuck, the mask having openings over the plurality of circuit elements; and
    depositing the plurality of solder bumps through the openings to connect the plurality of solder bumps to the plurality of circuit elements.

7. The method of claim 1, wherein the thinned portion is less than 300 microns.

8. The method of claim 1, wherein the at least one solder bump is greater than 150 microns in diameter.

9. The method of claim 1, further comprising:
    removing the ringed substrate from the mounting chuck;
    removing the outer ring from the ringed substrate;
    dicing the substrate to define individual chips, including at least one chip with the at least one circuit element; and
    mounting the at least one circuit element in a flip-chip assembly to at least one circuit board, including electrically connecting the at least one circuit element to the at least one circuit board using the at least one solder bump.

10. A method of making a semiconductor device, comprising:
    disposing a wafer on a mounting chuck of a mounting assembly, the wafer having a back side with a ring formed around a perimeter thereof and a thinned portion within the ring, the mounting chuck being disposed on the mounting assembly and including a raised portion configured to receive the thinned portion of the wafer and a recessed portion configured to receive the ring of the wafer; and
    forming an electrical connection to the wafer while the wafer is disposed on the mounting chuck with the thinned portion of the wafer on the raised portion of the mounting chuck, and the ring of the wafer disposed within the recessed portion of the mounting chuck.

11. The method of claim 10, comprising:
    forming, prior to the mounting, dual electroless nickel gold (ENIG) plating on at least one circuit element formed on a front side of the wafer that is opposite the back side, and on the thinned portion of the back side; and
    forming the electrical connection including at least one solder bump on the front side ENIG plating.

12. The method of claim 10, wherein the thinned portion and the ring are formed including:
    securing a front side of the wafer with back side grinding (BG) tape;
    grinding the back side of the wafer to define the thinned portion and the ring; and
    removing the BG tape.

13. The method of claim 10, wherein disposing the wafer comprises:
    moving the wafer onto the mounting chuck using a Bernoulli handler.

14. The method of claim 10, wherein forming the electrical connection comprises:
    depositing at least one solder bump for electrical connection to at least one circuit element formed on a front side of the wafer that is opposite the back side.

15. The method of claim 14, wherein the at least one circuit element includes a plurality of circuit elements formed on the front side, and wherein depositing the at least one solder bump comprises forming a plurality of solder bumps across the wafer and electrically connected to each of the plurality of circuit elements.

16. A method of making a semiconductor device, comprising:
    grinding a wafer to form a back side of the wafer with a ring formed around a perimeter thereof and a thinned portion within the ring;
    disposing the wafer on a mounting chuck having a raised portion configured to receive the thinned portion of the wafer and a recessed portion configured to receive the ring of the wafer; and
    forming at least one electrical connection to a front side of the wafer, opposite the back side, while the wafer is disposed on the mounting chuck.

17. The method of claim 16, wherein forming the electrical connection comprises:
    depositing at least one solder bump for electrical connection to at least one circuit element formed on the front side.

18. The method of claim 17, wherein the at least one circuit element includes a plurality of circuit elements formed on the front side, and wherein depositing the at least one solder bump comprises forming a plurality of solder bumps across the wafer and electrically connected to each of the plurality of circuit elements.

19. The method of claim 16, further comprising:
   removing the wafer from the mounting chuck;
   removing the ring from the wafer;
   dicing the wafer to define individual chips; and
   mounting at least one circuit element to which the at least one electrical connection is connected in a flip-chip assembly to at least one circuit board, including electrically connecting the at least one circuit element to the at least one circuit board using at least one solder bump.

20. The method of claim 16, wherein the at least one electrical connection is connected to a fast recovery diode (FRD) and an insulated gate bipolar transistor (IGBT).

* * * * *